United States Patent
Hansel et al.

(10) Patent No.: US 9,284,134 B2
(45) Date of Patent: Mar. 15, 2016

(54) METHOD AND APPARATUS FOR PLACING ADHESIVE ELEMENT ON A MATRIX

(75) Inventors: Mathias Hansel, Rummingen (DE); Herbert Le Pabic, Colmar (FR); Emilien Koelbert, Munchhouse (FR)

(73) Assignee: A. Raymond Et Cie, Grenoble (FR)

( * ) Notice: Subject to any disclaimer, the term of this patent is extended or adjusted under 35 U.S.C. 154(b) by 508 days.

(21) Appl. No.: 13/695,905

(22) PCT Filed: May 3, 2011

(86) PCT No.: PCT/IB2011/001349
§ 371 (c)(1),
(2), (4) Date: Apr. 4, 2013

(87) PCT Pub. No.: WO2011/138674
PCT Pub. Date: Nov. 10, 2011

(65) Prior Publication Data
US 2013/0200096 A1    Aug. 8, 2013

Related U.S. Application Data

(60) Provisional application No. 61/330,577, filed on May 3, 2010.

(51) Int. Cl.
| | | |
|---|---|---|
| *B32B 41/00* | (2006.01) | |
| *B65G 65/40* | (2006.01) | |
| *F16B 11/00* | (2006.01) | |
| *H01L 21/48* | (2006.01) | |
| *B29C 65/02* | (2006.01) | |
| *B29C 65/54* | (2006.01) | |

(52) U.S. Cl.
CPC ................ *B65G 65/40* (2013.01); *B29C 65/02* (2013.01); *B29C 65/544* (2013.01); *F16B 11/006* (2013.01); *H01L 21/486* (2013.01); *Y10T 156/17* (2015.01)

(58) Field of Classification Search
CPC ............... H01L 2924/15311; H05K 3/3478; H05K 2203/082; H05K 2201/10977; B23K 3/0692
USPC ............. 156/60, 64, 350, 378, 379; 257/737, 257/738; 228/245
See application file for complete search history.

(56) References Cited

U.S. PATENT DOCUMENTS 6,460,755 B1 *  10/2002  Inoue et al. ................... 228/246

FOREIGN PATENT DOCUMENTS

FR          2785140 A1 *   4/2000

* cited by examiner

Primary Examiner — Alison Hindenlang
Assistant Examiner — Joshel Rivera
(74) Attorney, Agent, or Firm — LeClairRyan (57) ABSTRACT

A method and apparatus for positioning, holding and moving formed adhesive elements (40) to a heated bonding part (42) are disclosed. The apparatus includes a hopper (12) movably positioned over a matrix plate (14). The matrix plate includes a nesting matrix (18) defined by formed adhesive element-receiving apertures (22). An ejector system (20) is fitted beneath the matrix plate and includes a body (24) having a vacuum chamber (26) with an air inlet (28) and an air exhaust (30). The chamber is fluidly continuous with the apertures formed in the matrix plate (14). The ejector system includes a lifting body to which ejector stamps (34, 34') and an inlet shut off shaft are attached. Channels for the ejector stamps are formed in the body of the ejector system. The ejector stamps are movably fitted in the apertures and the channels. In operation, the hopper (12) slides over the matrix and deposits formed adhesive elements into the apertures (22), then slides away.

17 Claims, 6 Drawing Sheets

METHOD AND APPARATUS FOR PLACING ADHESIVE ELEMENT ON A MATRIX

TECHNICAL FIELD

The disclosed invention relates to a bonding part attachable to a glass surface or other substrate through the use of adhesives. More particularly, the disclosed invention relates to a method and apparatus for attaching a prepared adhesive, such as a structural polyurethane, epoxy or other adhesive, pressed from a powder to an adhesive tablet, to a bonding part made of any one of several materials including, metal, glass, ceramics, plastics, wood and composites for attachment to another component such as a glass surface or to another substrate made of materials such metal, ceramics, plastics, wood and composites.

BACKGROUND OF THE INVENTION

Attachment of a first component to a second component for any of a variety of applications may be made by any of several known methods of fastening, including mechanical or chemical fastening. Mechanical fastening, while often practical and reliable, is not always usable for every application. For example, where a first component is being attached to a second component and it is not desirable or practical to drill into or otherwise modify the second component for mechanical attachment, chemical fastening is the only other alternative. This is the case where, for example, a component is to be attached to a glass surface or other substrate (the second component). An example of a component-to-glass arrangement may be seen in the automotive industry where a rear view mirror or a metal hinge needs to be attached to a glass surface. Other examples of component-to-glass attachment needs exist such as in home and office construction.

A solution to the bonding challenge was introduced in the form of an adhesive applied between the part to be attached (the bonding part) and the substrate to which the bonding part was attached. The adhesives have been applied in several ways.

According to one known approach, the adhesive is applied to the bonding part by dosing with nozzles and spraying the adhesive onto the bonding part. While this process can be easy and often inexpensive, it suffers from the need to frequently clean the nozzles in order to maintain a desired level of consistency in the actual spraying from part to part. In addition, the sprayed adhesive tends to be sticky, thus resulting in the possibility that the bonding part will come into contact with another object between the time of the spraying of the adhesive and the actual attachment of the bonding part to the substrate.

According to another known approach, a double-sided tape is applied to the bonding part. According to this approach a release layer is removed from one side of the tape and the tape is applied to the bonding part. The release layer on the other side of the tape is left in place until the bonding part is ready for attachment to the substrate. This approach offers advantages in that it is usable at room temperature and the adhesive for contact with the substrate is not exposed until needed. Furthermore, the adhesive does not require an adhesion promoter. However, while the release layer protects against the adhesive from being inadvertently attached to a surface, it also adds an inconvenient step in the process of attachment of the bonding part to the substrate in that the layer must be removed prior to attachment. The release layer may also tear, thus resulting in a portion of the layer being left behind on the adhesive surface and creating the potential for imperfect adhesion of the bonding part to the substrate. The step of attaching the double-sided tape to the bonding part is also complicated by the fact that this arrangement of structural adhesives can only be used for in-line assembly in which the bonding part, the double-sided tape and the substrate pass through a heater such as an autoclave to achieve full bonding performance.

A third and more attractive method is to provide the bonding part with a formed adhesive element such as a tablet already in position prior to shipment of the bonding part to the end-user. This arrangement is attractive as it results in a bonding part that is ready to bond with no requirement that the end user attach the adhesive tablet to the bonding part. However, it may be that the end user wishes to apply the tablet at its facility and according to its own schedule and arrangement. In such a case, the concept of a pre-applied adhesive such as the bonding tablet already fitted to the bonding part may not be the optimal choice.

Accordingly, as in so many areas of fastener technology, there is room in the art of bonding parts for an alternate approach to the manufacture of bonding parts.

SUMMARY OF THE INVENTION

The disclosed invention provides a method and apparatus for attaching formed adhesive elements to a heated bonding part. The apparatus includes a formed adhesive element-holding hopper movably positioned over a matrix plate. The matrix plate includes a nesting matrix defined by a plurality of formed adhesive element-receiving apertures. An ejector system is fitted beneath the matrix plate and includes a body having a vacuum chamber that is fluidly continuous with the apertures formed in the matrix plate. The vacuum chamber includes an air inlet and an air exhaust. The ejector system additionally includes a lifting body to which a plurality of ejector stamps and an inlet shut off shaft are attached. Channels for the ejector stamps are formed in the body of the ejector system. The ejector stamps are movably fitted in the apertures and the channels.

In operation, the hopper slides over the matrix and deposits formed adhesive elements into the apertures. The hopper then slides away. Movement of the formed adhesive elements into position into the apertures is assisted by a vacuum created in the vacuum chamber. A heated bonding part is positioned over and then lowered onto the formed adhesive elements in the apertures of the nesting matrix. Assisted by the upward movement of the lifting body and its associated ejector stamps, the bonding part with its attached formed adhesive elements is lifted away from the apparatus. The lifting body is then lowered to its fully retracted position, withdrawing the inlet shut off shaft from the air inlet and allowing air to flow into the vacuum chamber and the apertures and out of the air exhaust. The apparatus is then ready for another cycle.

Other advantages and features of the invention will become apparent when viewed in light of the detailed description of the preferred embodiment when taken in conjunction with the attached drawings and the appended claims.

BRIEF DESCRIPTION OF THE DRAWINGS

For a more complete understanding of this invention, reference should now be made to the embodiments illustrated in greater detail in the accompanying drawings and described below by way of examples of the invention wherein.

DETAILED DESCRIPTION OF THE PREFERRED EMBODIMENT

In the following figures, the same reference numerals will be used to refer to the same components. In the following description, various operating parameters and components are described for different constructed embodiments. These specific parameters and components are included as examples and are not meant to be limiting.

The formed adhesive elements referenced in the present application and their attachment to a bonding part are generally discussed in co-pending U.S. Ser. No. 13/695,896, incorporated by reference herein. A method and apparatus for transferring the formed adhesive elements from a holding reservoir to the stamp apertures is disclosed in co-pending U.S. Ser. No. 13/695,910, incorporated by reference herein.

The method and the apparatus for undertaking the positioning, holding and movement of formed adhesive elements for attachment to a bonding part according to the disclosed invention are set forth in FIGS. 1 through 7. With reference to these figures, an applicator apparatus, generally illustrated as 10, is shown. The applicator apparatus 10 includes a movable hopper 12 movably positioned over a matrix plate 14. The matrix plate 14 is mounted to a table 16. Formed in the matrix plate 14 is a nesting matrix 18. An ejector system 20 is fitted beneath the matrix plate 14.

The nesting matrix 18 includes a plurality of apertures 22 for the movable ejector stamps, discussed below. While five apertures 22 are illustrated, the number of apertures 22 may be greater or lesser. Two such apertures, 22 and 22', are shown in FIGS. 2 through 7.

Figure 1:
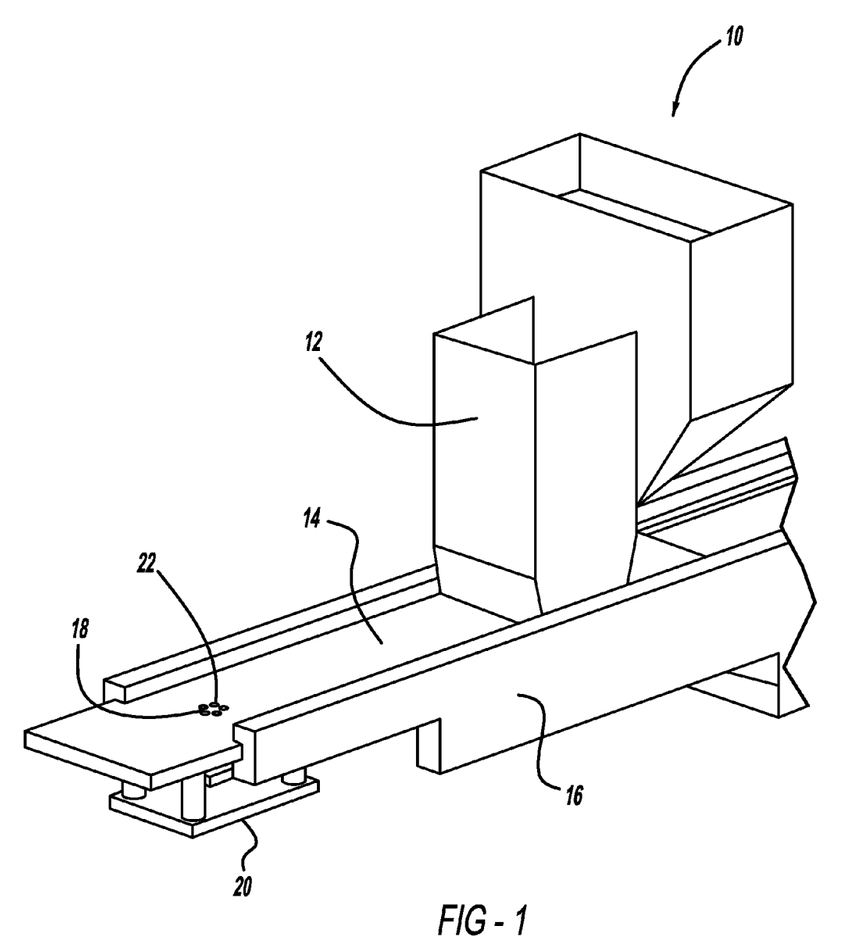
FIG. 1 is a perspective view of an embodiment of a tool for placing the formed adhesive element onto a matrix.
Figure 2:
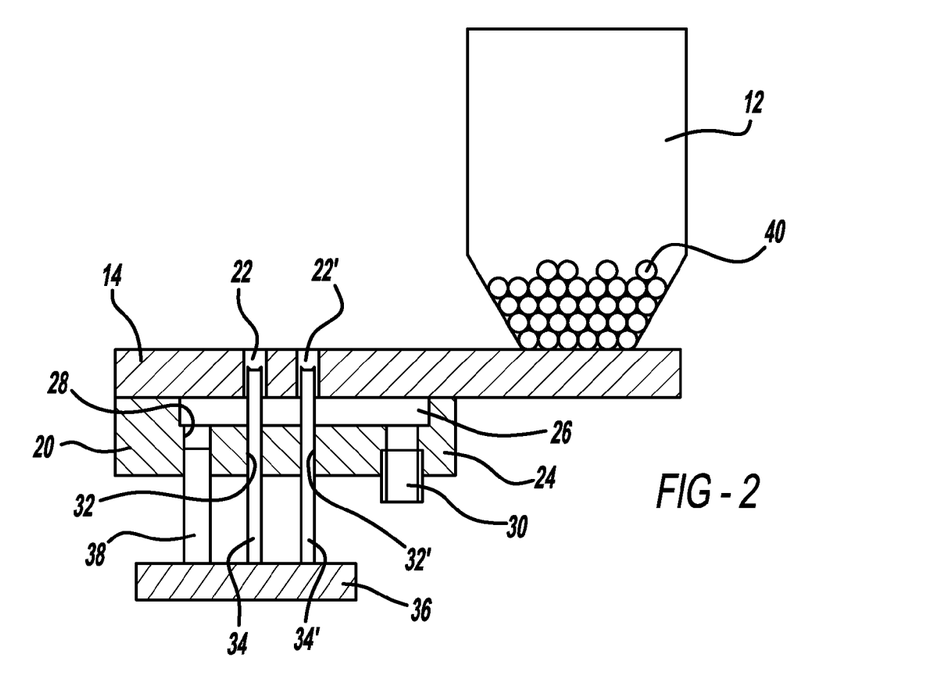
FIG. 2 is a sectional view of the tool shown in FIG. 2 in a pre-loaded condition.

The ejector system 20 includes a body 24 attached, preferably but not absolutely, to the underside of the matrix plate 14. The body 24 has centrally formed therein a vacuum chamber 26 into which the apertures 22 and 22' open. An air inlet 28 and an air exhaust 30 are formed in the body 24 and are continuous with the vacuum chamber 26. Also defined in the body 24 is a pair of ejector stamp channels 32 and 32'.

The ejector system 20 also includes at least one ejector stamp. Two such ejector stamps are illustrated as ejector stamps 34 and 34' although the actual number of stamps could be more or less than the two illustrated. A movable lifting body 36 forms provides a base for the stamps 34 and 34' to which they are attached. An inlet shut off shaft 38 is also attached to the movable lifting body 36.

The ejector stamps 34 and 34' are movably fitted in apertures 22 and 22' respectively. The ejector stamps 34 and 34' are also movably fitted in ejector stamp channels 32 and 32', also respectively. While the fit between the ejector stamps 34 and 34' and the interior surface of the ejector stamp channels 32 and 32' is relatively tight, the fit between the ejector stamps 34 and 34' and the walls of the apertures 22 and 22' is loose enough so that air can pass there between as will be discussed below.

Prior to operation of the applicator apparatus 10 the movable hopper 12 is at its idle position as shown in FIG. 2. Once formed adhesive elements 40 are placed within the movable hopper 12 operation of the apparatus 10 can be initiated. (It is to be understood that while the disclosed invention as illustrated and discussed refers to the hopper 12 as moving over the matrix plate 14 it may well be that the hopper 12 is fixed and the matrix plate 14 is moved into position beneath the hopper 12.)

Figure 3:
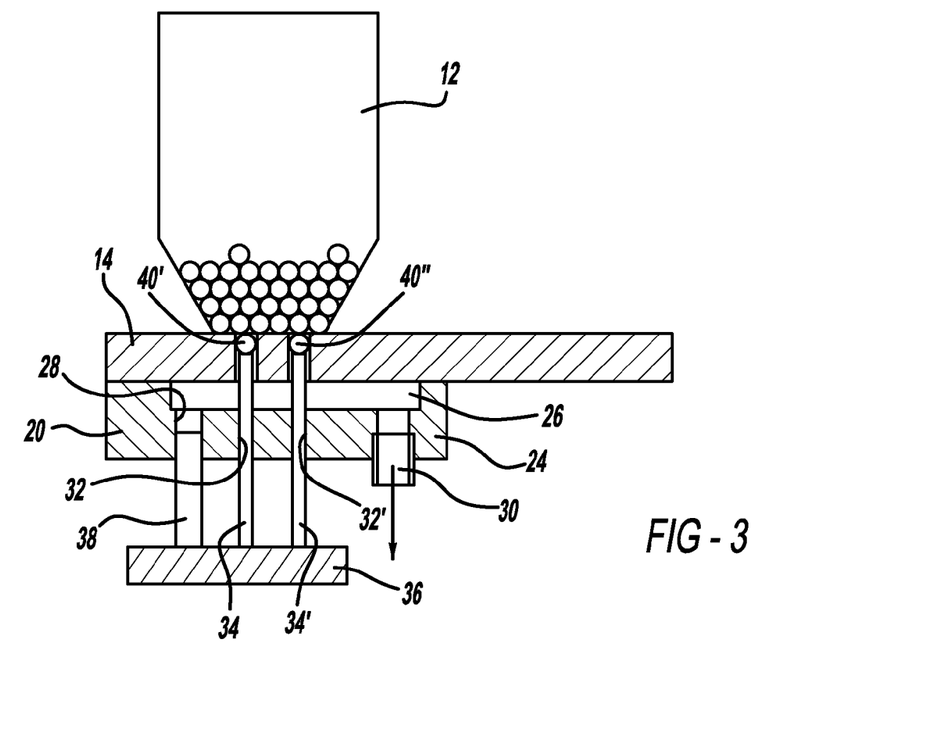
FIG. 3 is a view similar to that of FIG. 2 but showing the hopper of the tool of FIG. 1 in position over the apertures of the ejector stamps.

In operation, the movable hopper 12 moves from its idle position shown in FIG. 2 to its loading position as shown in FIG. 3. When in its loading position, the lower (open) end of the hopper 12 is positioned generally above the nesting matrix 18. Thus positioned, certain ones of the formed adhesive elements, in the illustrated example elements 40' and 40", fall into the apertures 22 and 22' respectively.

Figure 4:
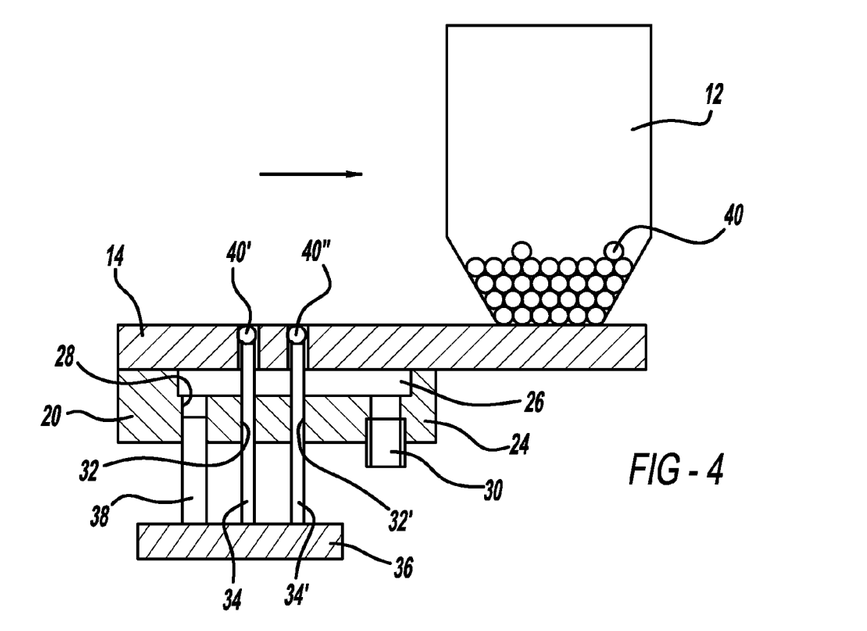
FIG. 4 is a view similar to that of FIG. 3 but showing the hopper moved out of its loading position to its resting position with the formed adhesive elements in position on the apertures of the ejector stamps.
Figure 5:
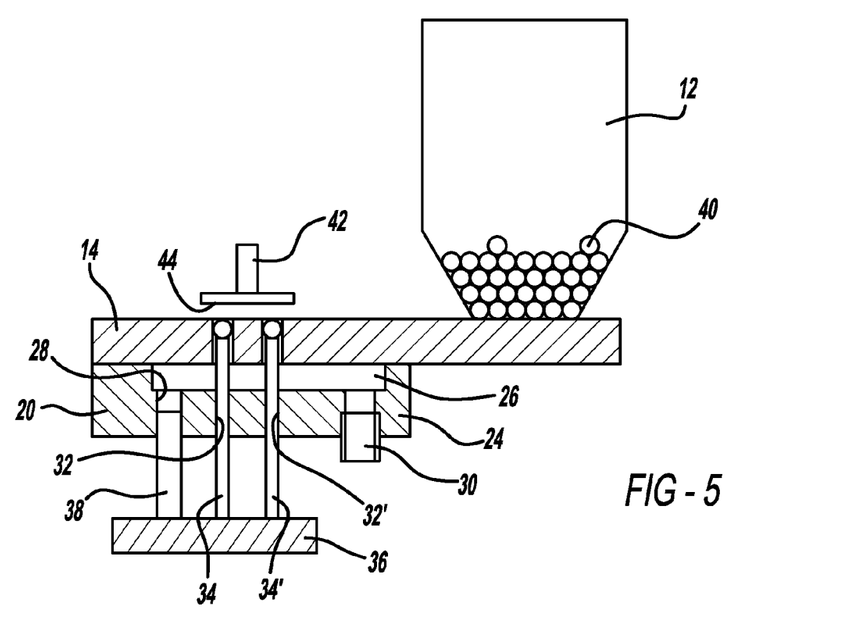
FIG. 5 is a view similar to that of FIG. 4 but showing a bonding part in position above the formed adhesive elements.

To assist in drawing the formed adhesive elements 40' and 40" into the apertures 22 and 22' and to hold them snugly therein, a vacuum created within the vacuum chamber 26 by the withdrawal of air from the vacuum chamber 26 by way of the air exhaust 30. As illustrated in FIGS. 3 through 5, the formed adhesive elements 40 and 40' fit snugly within the apertures 22 and 22' such that little or no air is allowed to pass between the formed adhesive elements 40' and 40" and the walls of the apertures 22 and 22'. In such case, the formed adhesive elements 40 and 40' are drawn into the apertures 22 and 22' and against the upper ends of the ejector stamps 34 and 34' respectively.

Once the formed adhesive elements 40' and 40" are loaded, the movable hopper 12 returns to its idle position as illustrated in FIG. 4. The nesting matrix 18, the vacuum chamber 26, and the ejector system 20 may be provided as a unit in the matrix plate 14. The unit may be interchangeable with other units, such a change being required according to different part references.

The next step of the attachment procedure involves the formed adhesive elements 40' and 40" being attached to the underside of a heated bonding part, such as the heated bonding part 42. The heated bonding part 42 includes an adhesive-contacting surface 44.

Particularly, the heated bonding part 42 is moved into position above the formed adhesive elements 40 and 40' as shown in FIG. 5. The heated bonding part 42 is then positioned a small distance above the matrix plate 14 and the formed adhesive elements 40' and 40".

Figure 6:
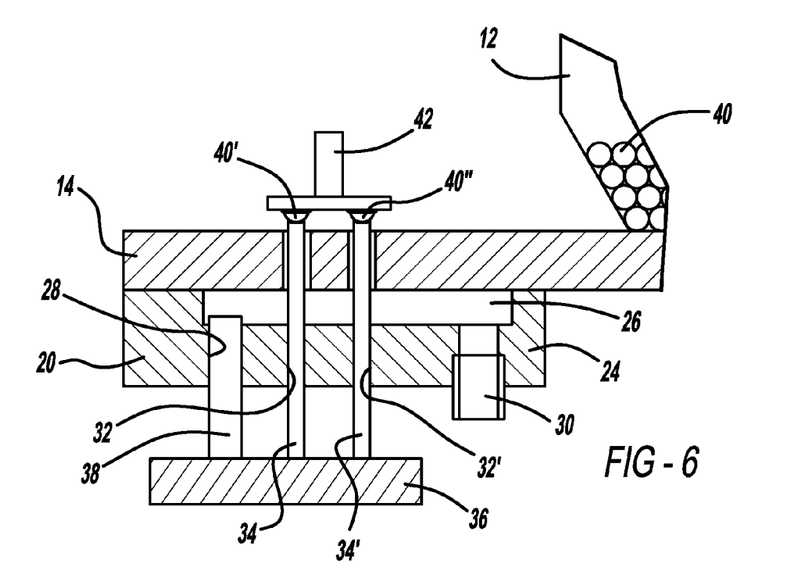
FIG. 6 is a view similar to that of FIG. 5 but showing a close up view to provide additional detail of the formed adhesive elements in contact with the bonding part.

The movable lifting body 36 of the ejector system 20 then moves upward toward the matrix plate 14 such that the ejector stamps 34 and 34' and the supported adhesive elements 40' and 40" are pushed upward out of the apertures 22 and 22' in a direction toward the adhesive-contacting surface 44 until the elements are sufficiently warmed so as to cause a partial melt of the formed adhesive elements 40' and 40" adequate to create adhesion onto the bonding part 42, as illustrated in FIG. 6. The pressure and position of the ejector stamps can be regulated.

Figure 7:
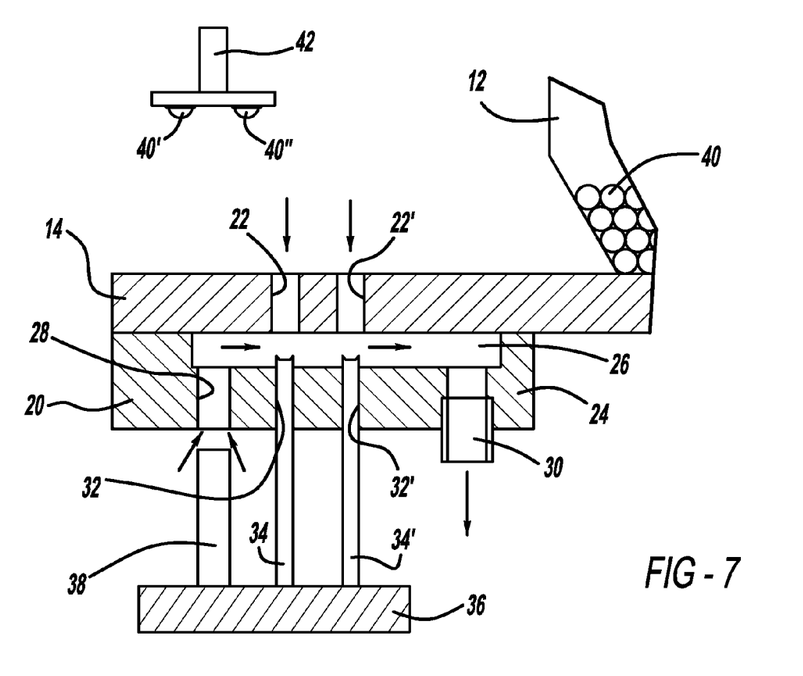
FIG. 7 is a view similar to that of FIG. 6 but showing the bonding part having been moved away from the matrix and the ejector assembly in its fully retracted position.

Once the formed adhesive elements 40' and 40" are adhered to the adhesive-contacting surface 44 of the bonding part 42, the movable lifting body 36 of the ejector system 20 is moved away from the matrix plate 14 and is lowered to its fully retracted position as illustrated in FIG. 7. In this position the uppermost ends of the ejector stamps 34 and 34' are substantially flush with the adjacent surface of the lower wall of the vacuum chamber 26. Simultaneously the inlet shut off shaft 38 is moved out of its air flow shut off position within the air inlet 28. As air continues to be drawn out of the air exhaust 30 air is drawn into the air inlet 28 and the apertures 22 and 22', thereby allowing air circulation to clean the internal elements of the ejector system 20 thus preparing it for the next operation. With the ejector stamps 34 and 34' substantially withdrawn from the vacuum chamber 26 little or no interference of passing air is created within the vacuum chamber 26 as it is drawn out through the air exhaust 30.

Figure 8:
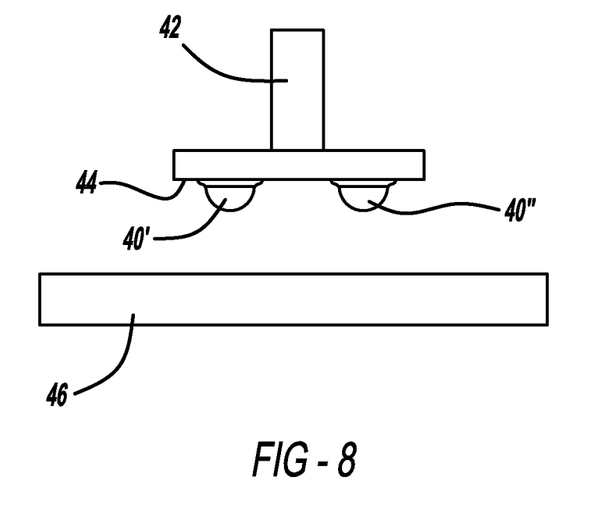
FIG. 8 is illustrates the bonding part and its attached formed adhesive elements fitted thereto and positioned over a substrate.
Figure 9:
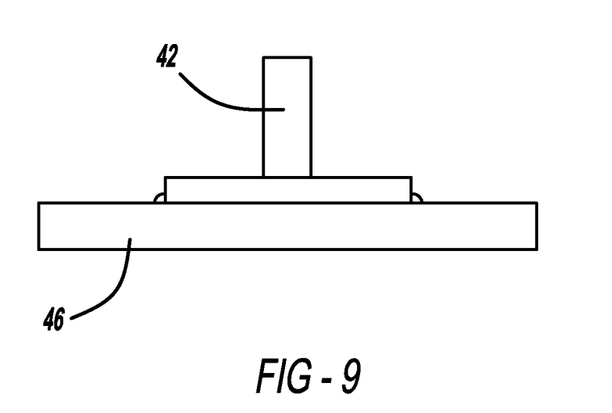
FIG. 9 is a view similar to that of FIG. 8 but illustrating the bonding part adhered to the substrate.

The bonding part 42 is then positioned above a substrate 46 as shown in FIG. 8 and is thereafter attached to the substrate 46 as illustrated in FIG. 9.

It should be noted that the method and apparatus of the disclosed invention may be used with bonding parts of a great variety of shapes and sizes. In addition, it should also be noted that while formed adhesive elements having spherical shapes are illustrated, other shapes, such as discs or tablets, may be used as well.

Figure 10:
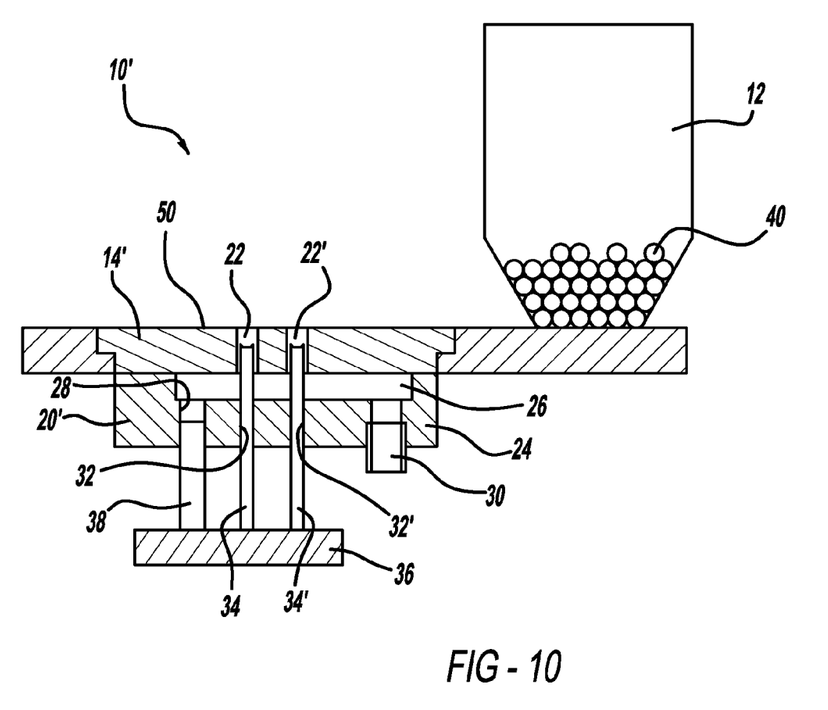
FIG. 10 is a view similar to that of the sectional view of FIG. 2 but illustrating an alternate embodiment of the disclosed invention.

FIG. 10 illustrates an alternate embodiment of the disclosed invention that allows for easy tool changes as is often required in production to accommodate bonding parts having different shapes and sizes. With respect to FIG. 10, an applicator apparatus, generally illustrated as 10', is shown. The applicator apparatus 10' includes the movable hopper 12 of the embodiment set forth above and shown in FIGS. 2 through 7. The movable hopper 12 is movably positioned over a matrix plate 14'. The applicator apparatus 10' includes an insert assembly 50. An ejector system 20' is attached to the underside of the insert assembly 50. The components of the ejector system 20' are preferably the same as those discussed above with respect to the ejector system 20.

The insert assembly 50 has formed therein apertures as set forth above with respect to the matrix 14. The number and arrangement of the apertures may be varied from insert assembly to insert assembly. The insert assembly 50 may be easily changed with another insert assembly in which the insert has a different number and/or a different arrangement of apertures.

Accordingly, the disclosed method and apparatus provides a robust, easy and cost effective method of positioning a formed adhesive element on a matrix plate for attachment to the bonding part.

The foregoing discussion discloses and describes exemplary embodiments of the present invention. One skilled in the art will readily recognize from such discussion, and from the accompanying drawings and claims that various changes, modifications and variations can be made therein without departing from the true spirit and fair scope of the invention as defined by the following claims.

What is claimed is:

1. An apparatus for positioning, holding and moving a formed adhesive element for attachment to a bonding part, the apparatus comprising:
    a support table;
    a matrix plate operatively associated with said support table, said matrix plate having at least one aperture for receiving the formed adhesive element;
    a formed adhesive element hopper operatively associated with said matrix plate, one of said matrix plate and said hopper being movable with respect to the other; and
    an ejector system for ejecting the formed adhesive element from said at least one aperture, said system including an ejector body and a movable lifting body, said ejector body having an air inlet associated therewith, said lifting body having attached thereto an inlet shut off shaft positionable substantially within said air inlet of said ejector body.

2. The apparatus of claim 1 wherein said hopper is reversibly movable between an idle position and a loading position above said at least one aperture.

3. The apparatus of claim 1 wherein said ejector body has a vacuum chamber formed therein.

4. The apparatus of claim 3 wherein said ejector body includes an air exhaust fluidly associated with said vacuum chamber, said air inlet also being fluidly connected with said vacuum chamber.

5. The apparatus of claim 4 wherein said lifting body has attached thereto at least one ejector stamp movably positionable through said ejector body and into said at least one aperture formed in said matrix plate.

6. The apparatus of claim 1 wherein the apparatus includes an interchangeable insert assembly having an insert positionable substantially within said matrix plate and wherein said ejector system is attached to said insert.

7. An apparatus for positioning, holding and moving formed adhesive elements for attachment to a bonding part, the apparatus comprising:
    a matrix plate having at least one aperture;
    a formed adhesive element holding hopper operatively associated with said matrix plate, one of said matrix plate and said hopper being movable with respect to the other; and
    an ejector system having at least one ejector stamp partially positionable within said at least one aperture of said matrix plate, said system including an ejector body and a movable lifting body operatively associated with said ejector body, said ejector body having an air inlet and said lifting body having attached thereto an air inlet shut off shaft at least partially positionable within said air inlet.

8. The apparatus of claim 7 further including a table to which said matrix plate and said ejector system are operatively associated.

9. The apparatus of claim 7 wherein said hopper is reversibly movable between an idle position and a loading position in which said hopper is positioned above said at least one aperture.

10. The apparatus of claim 9 wherein said ejector body has a vacuum chamber formed therein.

11. The apparatus of claim 10 wherein said ejector body includes an air exhaust fluidly associated with said vacuum chamber, said air inlet also being fluidly connected with said vacuum chamber.

12. The apparatus of claim 11 wherein said at least one ejector stamp is attached to said lifting body.

13. A method of positioning, holding and moving formed adhesive elements for attachment to a bonding part comprising the steps of:
    forming a positioning, holding, and moving apparatus including a matrix plate having at least one aperture for receiving a formed adhesive element, a formed adhesive element holding hopper, and an ejector system having at least one ejector stamp partially positionable within said at least one aperture, said ejector system including an ejector body and a movable lifting body operatively associated with said ejector body, said ejector body having an air inlet and said lifting body having attached thereto an air inlet shut off shaft at least partially positionable within said air inlet;

moving one of said matrix plate or said hopper to a position in which said hopper is above said at least one aperture;

allowing a formed adhesive element to exit said hopper and locate in said at least one aperture;

moving one of said matrix plate or said hopper to a position in which said hopper is not above said at least one aperture; positioning a bonding part above said formed adhesive element; and causing said ejector system to move said at least one ejector stamp to move said formed adhesive element into contact with said bonding part.

14. The method of claim 13 including the step of heating said bonding part prior to the formed adhesive element being moved into contact with said bonding part.

15. The method of claim 13 wherein said at least one ejector stamp is attached to said lifting body.

16. The method of claim 15 wherein said ejector body includes a vacuum chamber formed therein to which said at least one aperture is fluidly connected, said ejector body further including an air exhaust fluidly connected with said vacuum chamber, said air inlet also being fluidly connected with said vacuum chamber.

17. The method of claim 16 including the step of creating a vacuum within said vacuum chamber such that the formed adhesive element is drawn against said at least one ejector stamp when positioned thereon.

\* \* \* \* \*